United States Patent
Kang et al.

(10) Patent No.: US 8,629,448 B2
(45) Date of Patent: Jan. 14, 2014

(54) FLAT PANEL DISPLAY DEVICE AND METHOD OF MANUFACTURING THE SAME

(75) Inventors: Jin-Hee Kang, Yongin (KR); Chun-Gi You, Yongin (KR); Sun Park, Yongin (KR); Jong-Hyun Park, Yongin (KR); Yul-Kyu Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 140 days.

(21) Appl. No.: 12/923,599

(22) Filed: Sep. 29, 2010

(65) Prior Publication Data
US 2011/0140107 A1 Jun. 16, 2011

(30) Foreign Application Priority Data
Dec. 10, 2009 (KR) .................. 10-2009-0122492

(51) Int. Cl.
*H01L 27/04* (2006.01)
*H01L 29/423* (2006.01)
*H01L 29/786* (2006.01)

(52) U.S. Cl.
USPC ............... 257/72; 257/E33.064; 257/E29.112

(58) Field of Classification Search
None
See application file for complete search history.

(56) References Cited

U.S. PATENT DOCUMENTS

| | | | |
|---|---|---|---|
| 7,619,286 B2 * | 11/2009 | Park | 257/390 |
| 8,164,096 B2 * | 4/2012 | Choi et al. | 257/72 |
| 2007/0252145 A1 * | 11/2007 | Toyota et al. | 257/59 |
| 2007/0278480 A1 * | 12/2007 | Hwang et al. | 257/40 |
| 2008/0233665 A1 * | 9/2008 | Jung et al. | 438/23 |
| 2009/0104737 A1 * | 4/2009 | Sato et al. | 438/154 |

FOREIGN PATENT DOCUMENTS

| | | | | |
|---|---|---|---|---|
| JP | 2007-298649 A | 11/2007 | | |
| JP | 2008-235848 A | 10/2008 | | |
| JP | 2009-099888 A | 5/2009 | | |
| KR | 10-2004-0037889 A | 5/2004 | | |
| KR | 10-2005-0081542 A | 8/2005 | | |
| KR | 10-2004-0037889 A * | 5/2006 | ............ | H05B 33/10 |
| KR | 10-2006-0067050 A | 6/2006 | | |
| KR | 10-2007-0115355 A | 12/2007 | | |

OTHER PUBLICATIONS

Machine Translation of KR-10-2004-0037889-A.*
Office Action issued in corresponding Korean application, 10-2009-0122492, dated Mar. 24, 2011.
Korean Office Action in KR 10-2009-0122492, dated Jun. 28, 2011 (Kang, et al.).
Japanese Office Action in JP 2010-104023, dated Jun. 5, 2012 (Kang, et al.).

* cited by examiner

*Primary Examiner* — Thomas L Dickey
*Assistant Examiner* — Joseph Schoenholtz
(74) *Attorney, Agent, or Firm* — Lee & Morse, P.C.

(57) ABSTRACT

A flat panel display device including a substrate including first and second regions; an active layer on the first region of the substrate including a semiconductor material; a lower electrode on the second region of the substrate including the semiconductor material; a first insulating layer on the substrate including the active layer and the lower electrode thereon; a gate electrode on the first insulating layer overlying the active layer and including a first conductive layer pattern and a second conductive layer pattern; an upper electrode on the first insulating layer overlying the lower electrode and including the first conductive layer pattern and the second conductive layer pattern; a second insulating layer on the gate electrode and the upper electrode exposing portions of the active layer and portions of the upper electrode; and a source electrode and a drain electrode connected to the exposed portions of the active layer.

5 Claims, 9 Drawing Sheets

FLAT PANEL DISPLAY DEVICE AND METHOD OF MANUFACTURING THE SAME

BACKGROUND

1. Field of the Invention

Embodiments relate to a flat panel display device and method of manufacturing the same.

2. Description of the Related Art

Flat panel display devices, e.g., liquid crystal display devices (LCDs), which use electrical-optical properties of a liquid crystal, and organic light emitting display devices (OLEDs), which use self-emission features of an organic light emitting diodes, may include a passive matrix type and an active matrix type. The active matrix type may be desirable because it has excellent resolution and is suitable for displaying videos, as compared with the passive matrix type.

Active matrix flat panel display devices may include a thin film transistor and a capacitor. Accordingly, multiple masks and processes for manufacturing the thin film transistor and the capacitor may be required. For example, a mask for forming an active layer of the thin film transistor and a lower electrode of the capacitor, a mask for forming a gate electrode of the thin film transistor and an upper electrode of the capacitor, a mask for exposing source and drain regions, and a mask for forming a source electrode and a drain electrode may be required.

SUMMARY

Embodiments are directed to a flat panel display device and method of manufacturing the same, which represent advances over the related art.

It is a feature of an embodiment to provide a flat panel display device that can be manufactured using a small number of masks, thus reducing manufacturing costs.

At least one of the above and other features and advantages may be realized by providing a flat panel display device including a substrate, the substrate including a first region and a second region; an active layer on the first region of the substrate, the active layer including a semiconductor material; a lower electrode on the second region of the substrate, the lower electrode including the semiconductor material; a first insulating layer on the substrate including the active layer and the lower electrode thereon; a gate electrode on the first insulating layer, the gate electrode overlying the active layer and including a first conductive layer pattern and a second conductive layer pattern; an upper electrode on the first insulating layer, the upper electrode overlying the lower electrode and including the first conductive layer pattern and the second conductive layer pattern; a second insulating layer on the gate electrode and the upper electrode, the second insulating layer exposing portions of the active layer and portions of the upper electrode; and a source electrode and a drain electrode connected to the exposed portions of the active layer.

The semiconductor material may include amorphous silicon or a polysilicon.

The lower electrode may include dopant ions implanted therein.

The first conductive layer pattern may include at least one of amorphous ITO, ITO, poly-ITO, and IZO.

The second conductive layer pattern may include at least one of tungsten (W), titanium (Ti), molybdenum (Mo), silver (Ag), tantalum (Ta), aluminum (Al), copper (Cu), gold (Au), chromium (Cr), niobium (Nb), and alloys thereof.

The second conductive layer pattern corresponding to the upper electrode may be interposed between edges of the corresponding first conductive layer pattern and the second insulating layer thereon.

At least one of the above and other features and advantages may also be realized by providing a flat panel display device including a substrate, the substrate including a first region, a second region, and a third region; an active layer on the first region of the substrate, the active layer including a semiconductor material; a lower electrode on the second region of the substrate, the lower electrode including the semiconductor material; a first insulating layer on the substrate including the active layer and the lower electrode thereon; a gate electrode on the first insulating layer, the gate electrode overlying the active layer and including a first conductive layer pattern and a second conductive layer pattern; an upper electrode on the first insulating layer, the upper electrode overlying the lower electrode and including the first conductive layer pattern and the second conductive layer pattern; an anode electrode on the first insulating layer in the third region, the anode electrode including the first conductive layer pattern and the second conductive layer pattern; a second insulating layer on the gate electrode, the upper electrode, and the anode electrode, the second insulating layer exposing portions of the active layer, the anode electrode, and the upper electrode; a source electrode connecting exposed portions of the active layer and the anode electrode; a drain electrode connected to exposed portions of the active layer; a pixel defining layer on the substrate including the source electrode and drain electrode thereon, the pixel defining layer exposing portions of the anode electrode in the light emitting region; an organic light emitting layer on the anode electrode in the light emitting region; and a cathode electrode on the organic light emitting layer.

The semiconductor material may include amorphous silicon or polysilicon.

The lower electrode may include dopant ions implanted therein.

The first conductive layer pattern may include at least one of amorphous ITO, ITO, poly-ITO, and IZO.

The second conductive layer pattern may include at least one of tungsten (W), titanium (Ti), molybdenum (Mo), silver (Ag), tantalum (Ta), aluminum (Al), copper (Cu), gold (Au), chromium (Cr), niobium (Nb), and alloys thereof.

The second conductive layer pattern corresponding to the upper electrode may be interposed between edges of the corresponding first conductive layer pattern and the second insulating layer thereon.

The substrate may include transparent glass or plastic.

At least one of the above and other features and advantages may also be realized by providing a flat panel display device including a substrate, the substrate including a first region, a second region, and a third region; an active layer on the first region of the substrate, the active layer including a semiconductor material; a lower electrode on the second region of the substrate, the lower electrode including the semiconductor material; a first insulating layer on the substrate including the active layer and the lower electrode thereon; a gate electrode on the first insulating layer, the gate electrode overlying the active layer and including a first conductive layer pattern and a second conductive layer pattern; an upper electrode on the first insulating layer, the upper electrode overlying the lower electrode and including the first conductive layer pattern and the second conductive layer pattern; a second insulating layer on the gate electrode and the upper electrode, the second insulating layer exposing portions of the active layer and portions of the upper electrode; a source electrode and a drain electrode connected to the exposed portions of the active layer; a third insulating layer on the substrate including the source electrode and drain electrode thereon, the third insulating layer exposing portions of the source electrode or the drain electrode; an anode electrode connected to the exposed portion of the source electrode or drain electrode; a pixel defining layer on the anode electrode, the pixel defining layer exposing portions of the anode electrode; an organic light emitting layer on the anode electrode in the light emitting region; and a cathode electrode on the organic light emitting layer.

The semiconductor material may include amorphous silicon or polysilicon.

The lower electrode may include dopant ions implanted therein.

The first conductive layer pattern may include at least one of amorphous ITO, ITO, poly-ITO, and IZO.

The second conductive layer pattern may include at least one of tungsten (W), titanium (Ti), molybdenum (Mo), silver (Ag), tantalum (Ta), aluminum (Al), copper (Cu), gold (Au), chromium (Cr), niobium (Nb), and alloys thereof.

The second conductive layer pattern corresponding to the upper electrode may be interposed between edges of the corresponding first conductive layer pattern and the second insulating layer thereon.

The substrate may include transparent glass or plastic.

At least one of the above and other features and advantages may also be realized by providing a method of manufacturing a flat panel display device, the method including providing a substrate such that the substrate includes a first region and a second region; forming and patterning a semiconductor material layer on the substrate to form an active layer in the first region and a lower electrode in the second region; forming a first insulating layer on the substrate including the active layer and the lower electrode thereon; forming a first conductive layer and a second conductive layer on the first insulating layer; patterning the first conductive layer and the second conductive layer to form a gate electrode on the first insulating layer such that the gate electrode overlies the active layer and includes a first conductive layer pattern and a second conductive layer pattern, and an upper electrode on the first insulating layer such that the upper electrode overlies the lower electrode and includes the first conductive layer pattern and the second conductive layer pattern; forming a second insulating layer on the first insulating layer including the gate electrode and the upper electrode thereon; patterning the second insulating layer to form an aperture pattern such that the aperture pattern exposes portions of the active layer and portions of the upper electrode; forming a third conductive layer on the second insulating layer such that the third conductive layer fills the aperture pattern; patterning the third conductive layer to form a source electrode and a drain electrode such that the source and drain electrodes are connected to exposed portions of the active layer; removing portions of the second conductive layer pattern of the upper electrode in the second region exposed by the aperture pattern; and implanting ions into the lower electrode through the aperture pattern, the first conductive layer pattern, and the first insulating layer corresponding to the aperture pattern.

The semiconductor layer may include amorphous silicon or polysilicon.

The first conductive layer may include one of amorphous ITO, ITO, poly-ITO, and IZO.

The second conductive layer may include at least one of tungsten (W), titanium (Ti), molybdenum (Mo), silver (Ag), tantalum (Ta), aluminum (Al), copper (Cu), gold (Au), chromium (Cr), niobium (Nb), and alloys thereof.

BRIEF DESCRIPTION OF THE DRAWINGS

The above and other features and advantages will become more apparent to those of ordinary skill in the art by describing in detail exemplary embodiments with reference to the attached drawings, in which:

FIGS. 3A to 3I illustrates cross-sectional views of stages in a method of manufacturing a flat panel display device according to an;

DETAILED DESCRIPTION

Figure 1:
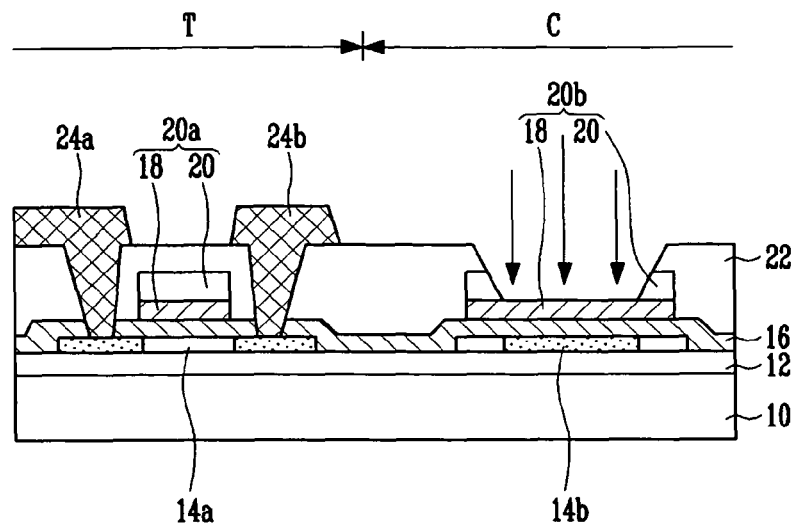
FIG. 1 illustrates a cross-sectional view of a flat panel display device according to an embodiment.

Korean Patent Application No. 10-2009-0122492, filed on Dec. 10, 2009, in the Korean Intellectual Property Office, and entitled: "Flat Panel Display Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected to" another element, it can be directly connected to the another element or be indirectly connected to the another element with one or more intervening elements interposed therebetween.

FIG. 1 illustrates a cross-sectional view of a flat panel display device according to an embodiment. In FIG. 1, regions where a thin film transistor and a capacitor are formed are schematically shown.

A substrate 10 made of, e.g., an insulating material, may include a thin film transistor forming region T and a capacitor forming region C. A buffer layer 12 may be disposed on the transistor forming region T and the capacitor forming region C of the substrate 10. An active layer 14a including a channel region and source and drain regions may be disposed on the buffer layer 12 in the transistor forming region T. A lower electrode 14b may be disposed on the buffer layer 12 in the capacitor forming region C. The active layer 14a and the lower electrode 14b may include a semiconductor material made of, e.g., amorphous silicon or polysilicon. Dopant ions may be implanted in the lower electrode 14d for conductivity.

In an implementation, the lower electrode 14b and the active layer 14a may be disposed in the same plane on the buffer layer 12.

A first insulating layer 16 may be disposed on the buffer layer 12 including the active layer 14a and the lower electrode 14b thereon. The first insulating layer 16 may serve as a gate insulating layer of the thin film transistor and a dielectric of the capacitor.

A gate electrode 20a including a first conductive layer pattern 18 and a second conductive layer pattern 20 may be disposed on the first insulating layer 16 over, i.e., may overlie, the active layer 14a. An upper electrode 20b including the first conductive layer pattern 18 and the second conductive layer pattern 20 may be disposed on the first insulating layer 16 over, i.e., may overlie, the lower electrode 14b. In an implementation, the first conductive layer patterns 18 and the second conductive layer patterns 20 of the gate electrode 20a and upper electrode 20b may be disposed in the same plane, respectively, on the first insulating layer 16.

A second insulating layer 22 may be disposed on the first insulating layer 16 including the gate electrode 20a and the upper electrode 20b thereon. An aperture pattern, i.e., a plurality of openings, may be formed in the second insulating layer 22 to expose portions of the source and drain regions of the active layer 14a as well as portions of the upper electrode 20b. The second conductive layer pattern 20 of the upper electrode 20b may be interposed between edges of the corresponding first conductive layer pattern 18 and the second insulating layer 22 thereon. The first conductive layer pattern 18 may include, e.g., a transparent conductive material; and the second conductive layer pattern 20 may include, e.g., metal or an alloy.

A source electrode 24a may be disposed on the second insulating layer 22 and may be connected to the source region of the active layer 14a through the aperture pattern. A drain electrode 24b may be disposed on the second insulating layer 22 and may be connected to the drain region of the active layer 14a through the aperture pattern.

Figure 2:
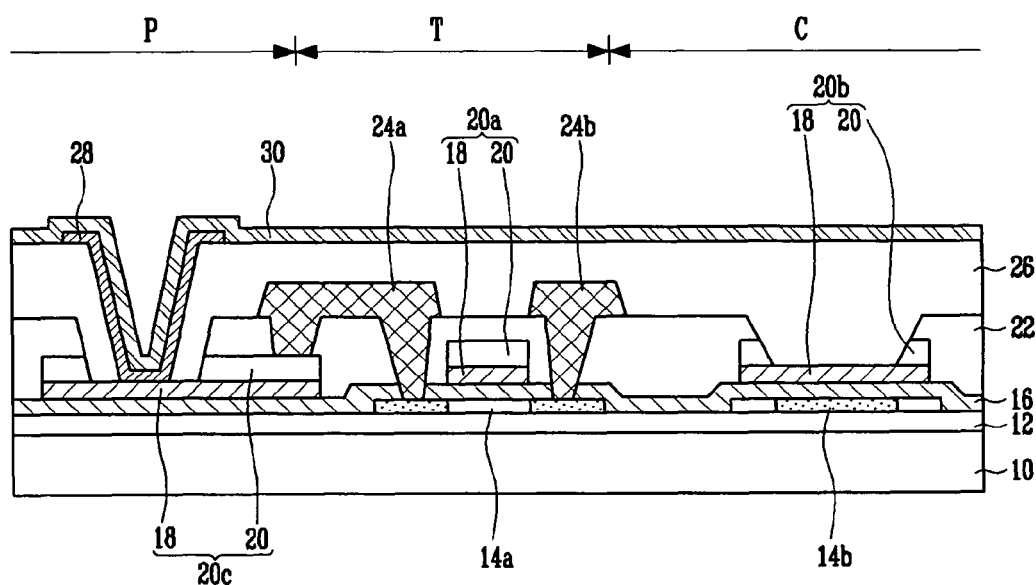
FIG. 2 illustrates a cross-sectional view of a flat panel display device according to another embodiment.

FIG. 2 illustrates a cross-sectional view of a flat panel display device according to another embodiment. In particular, the flat panel device illustrated in FIG. 2 may a bottom emission type of organic light emitting display device.

A substrate 10 made of an insulating material, e.g., transparent glass and/or plastic, may include a thin film transistor forming region T, a capacitor forming region C, and a pixel forming region P. A buffer layer 12 may be disposed on the thin film transistor forming region T, the capacitor forming region C, and the pixel forming region P of the substrate 10. An active layer 14a including a channel region, a source region, and a drain region may be disposed on the buffer layer 12 in the thin film transistor forming region T. A lower electrode 14b may be disposed on the buffer layer 12 in the capacitor forming region C. The active layer 14a and the lower electrode 14b may include a semiconductor material, e.g., amorphous silicon or polysilicon. Dopant ions may be implanted in the lower electrode 14d for conductivity. In an implementation, the lower electrode 14b and the active layer 14a may be disposed in the same plane on the buffer layer 12.

A first insulating layer 16 may be disposed on the buffer layer 12 including the active layer 14a and the lower electrode 14b thereon. The first insulating layer 16 may serve as a gate insulating layer of the thin film transistor and a dielectric of the capacitor.

A gate electrode 20a including a first conductive layer pattern 18 and a second conductive layer pattern 20 may be disposed on the first insulating layer 16 over, i.e., may overlie, the active layer 14a. An upper electrode 20b including the first conductive layer pattern 18 and the second conductive layer pattern 20 may be disposed on the first insulating layer 16 over, i.e., may overlie, the lower electrode 14b. An anode electrode 20c including the first conductive layer pattern 18 and the second conductive layer pattern 20 may be disposed on the first insulating layer 16 in the pixel forming region P. In an implementation, the first conductive layer patterns 18 and the second conductive layer patterns 20 of the gate electrode 20a and upper electrode 20b may be disposed in the same plane, respectively, on the first insulating layer 16.

A second insulating layer 22 may be disposed on the first insulating layer 16 including the gate electrode 20a, the upper electrode 20b, and the anode electrode 20c thereon. An aperture pattern, i.e., a plurality of openings, may be formed in the second insulating layer 22 to expose portions of the source and drain regions of the active layer 14a, portions of the upper electrode 20b, and portions of the anode electrode 20c in the light emitting region. The second conductive layer pattern 20 of the upper electrode 20b may be interposed between edges of the corresponding first conductive layer pattern 18 and the second insulating layer 22 thereon. In addition, the second conductive layer pattern 20 of the anode electrode 20c may be interposed between edges of the corresponding first conductive layer pattern 18 and the second insulation layer 22 thereon. The first conductive layer 18 may include, e.g., a transparent conductive material; and the second conductive layer 20 may include, e.g., a metal or an alloy.

A source electrode 24a may be formed on the second insulating layer 22 and may be connected to both the source region of the active layer 14a and the anode electrode 20c in the light emitting region through the aperture pattern. A drain electrode 24b may be disposed on the second insulation layer 22 and may be connected to the drain region of the active layer 14a through the aperture pattern.

A pixel defining layer 26 may be disposed on the second insulating layer 22 including the source electrode 24a and the drain electrode 24b thereon. An aperture pattern may be formed in the pixel defining layer 26 to expose portions of the anode electrode 20c in the light emitting region. An organic light emitting layer 28 may be disposed on exposed portions of the anode electrode 20c in the light emitting region. A cathode electrode 30 may be disposed on the pixel defining layer 26 including the organic light emitting layer 28 thereon.

In the flat panel display device according to the present embodiment, signals provided from outside may be stored in the capacitor. Further, signals may be provided to the anode electrode 20c by the thin film transistor. Thus, when a predetermined voltage is applied to the anode electrode 20c and the cathode electrode 30, holes injected from the anode electrode 20c and electrons injected from the cathode electrode 30 may be recombined in the organic light emitting layer 28. Accordingly, characters and/or images may be displayed by light emitted from the organic light emitting layer 28 to the outside through the substrate 10.

The embodiments will now be described in more detail through a manufacturing process of a flat panel display device having the above configuration.

FIGS. 3A to 3I illustrate cross-sectional views of stages in a method of manufacturing a flat panel display device according to an embodiment. In particular, a method of manufacturing the structure of the flat panel display device of FIG. 2 is exemplified in the following description.

Figure 3A:
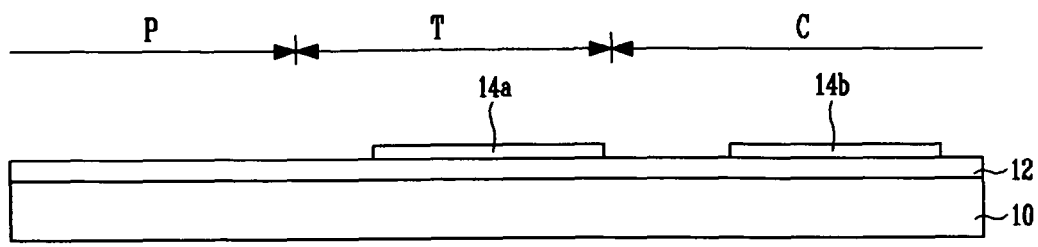

Referring to FIG. 3A, a substrate 10 including a thin film transistor forming region T, a capacitor forming region C, and a pixel forming region P may be provided. A buffer layer 12 and a semiconductor layer (not illustrated) may be sequentially formed on the substrate 10 including the thin film transistor forming region T, the capacitor forming region C, and the pixel forming region P. The semiconductor layer may be patterned to form an active layer 14a including a channel region, a source region, and a drain region on the buffer layer 12 in the thin film transistor forming region T and a lower electrode 14b on the buffer layer 12 in the capacitor forming region C. Thus, the active layer 14a and the lower electrode 14b may be formed at the same time. The patterning may be carried out by, e.g., photolithography and etching, using a first mask. The semiconductor layer may include, e.g., amorphous silicon or polysilicon, and, if desired, may be subjected to crystallization.

Figure 3B:
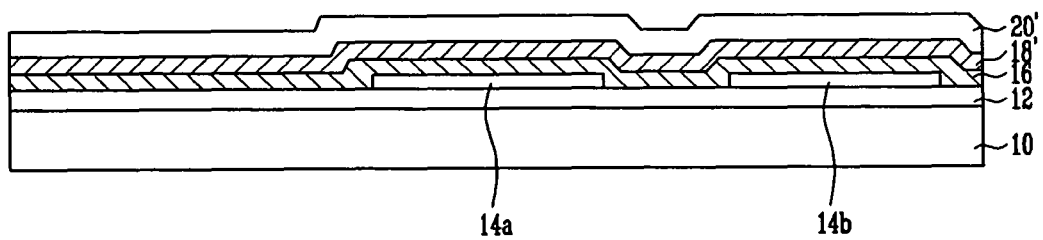

Referring to FIG. 3B, a first insulating layer 16, a first conductive layer 18', and a second conductive layer 20' may be sequentially formed on the buffer layer 12 including the active layer 14a and the lower electrode 14b thereon. The first insulating layer 16 may include, e.g., a silicon oxide film $SiO_2$. The first conductive layer 18' may include, e.g., a transparent conductive material having conductivity sufficient to be used an electrode. In an implementation, the transparent conductive material may include e.g., amorphous ITO (Indium Tin Oxide), ITO, poly-ITO, and/or IZO (Indium Zinc Oxide). The second conductive layer 20' may include, e.g., metal. In an implementation, the metal may include, e.g., tungsten (W), titanium (Ti), molybdenum (Mo), silver (Ag), tantalum (Ta), aluminum (Al), copper (Cu), gold (Au), chromium (Cr), niobium (Nb), and/or alloys thereof.

Figure 3C:
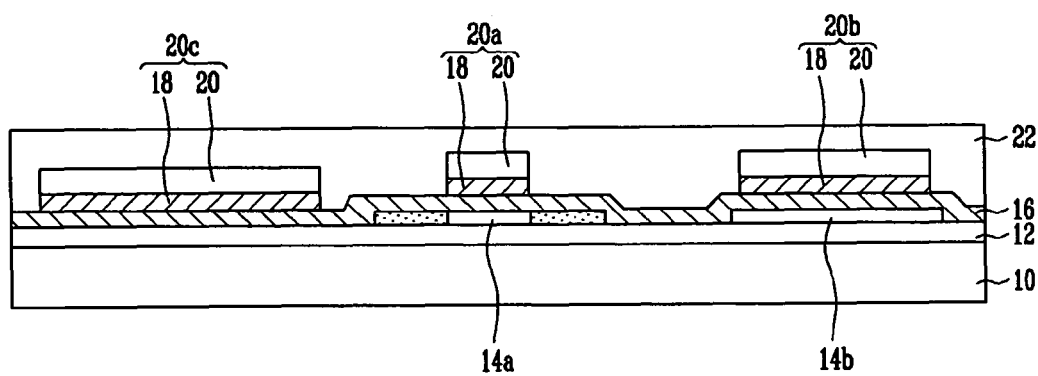

Referring to FIG. 3C, a gate electrode 20a, an upper electrode 20b, and an anode electrode 20c may be formed by patterning the first conductive layer 18' and the second conductive layer 20' on the active layer 14a, the lower electrode 14b, and the pixel forming region P, respectively. Thus, the gate electrode 20a, the upper electrode 20b, and the anode electrode 20c may each include a first conductive layer pattern 18 and a second conductive layer pattern 20 and may be formed at the same time. The patterning may be carried out by, e.g., photolithography and etching, using a second mask. In an implementation, high-density dopant ions may be implanted into the source region and the drain region of the active layer 14a in, using the gate electrode 20a as a mask.

Then, a second insulating layer 22 may be formed on the first insulating layer 16 including the gate electrode 20a, the upper electrode 20b, and the anode electrode 20c thereon.

Figure 3D:
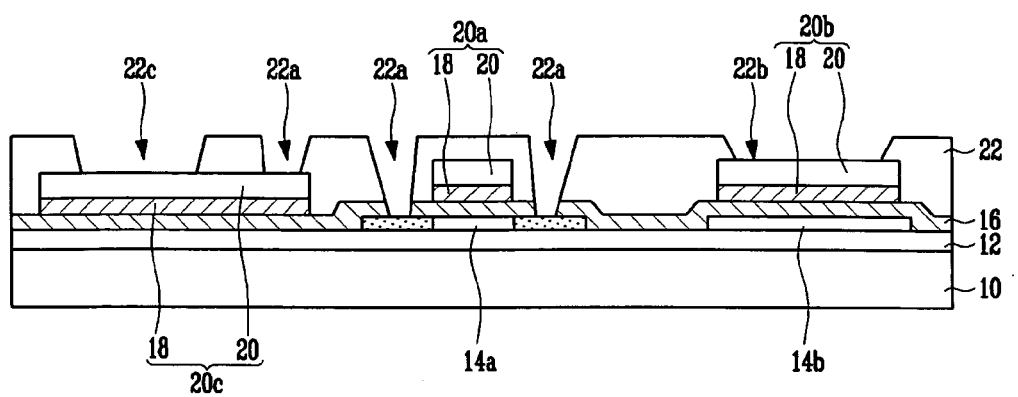

Referring to FIG. 3D, an aperture pattern, i.e., a plurality of openings, including apertures 22a, 22b, and 22c may be formed by patterning the second insulating layer 22 and the first insulating layer 16 by, e.g., photolithography and etching, using a third mask. The apertures 22a, 22b, and 22c may expose portions of the source and drain regions of the active layer 14a, portions of the upper electrode 20b, and portions of the anode electrode 20c in the light emitting region.

Figure 3E:
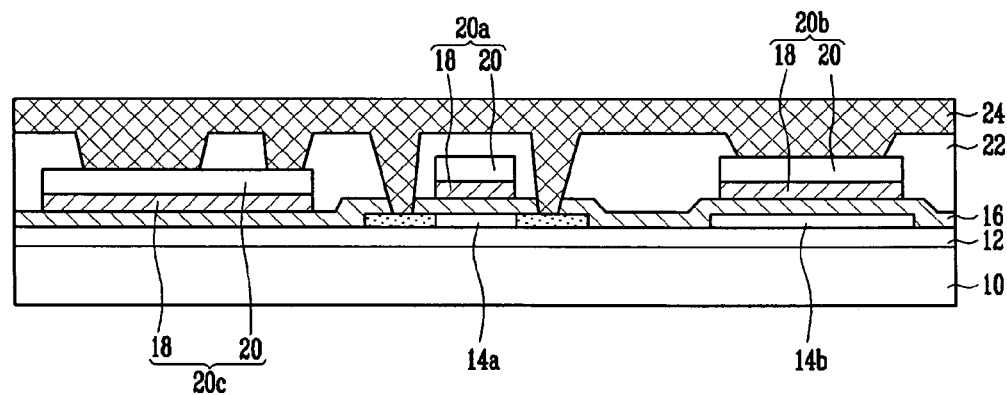

Referring to FIG. 3E, a conductive layer 24 may be formed on the insulating layer 22 to fill the apertures 22a, 22b, and 22c.

Figure 3F:
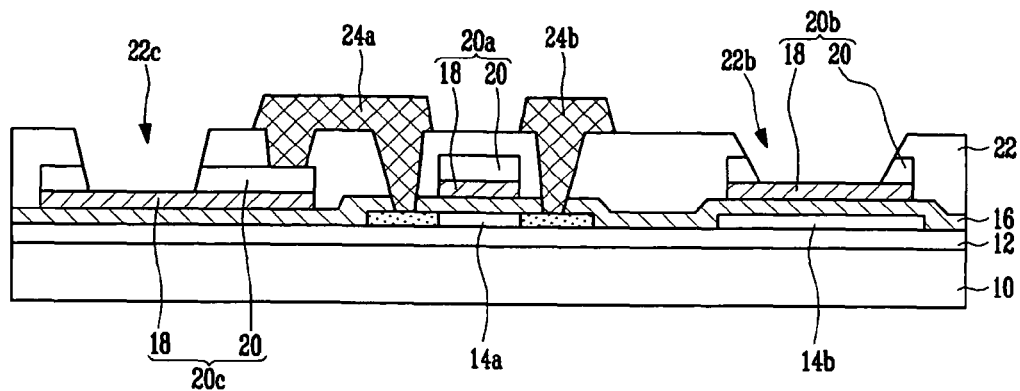

Referring to FIG. 3F, the conductive layer 24 may be patterned to form a source electrode 24a connected to both the source region of the active layer 14a and the anode electrode 20c in the light emitting region as well as a drain electrode 24b connected to the drain region of the active layer 14a through the aperture 22a. The patterning may be carried out by, e.g., photolithography and etching, using a fourth mask. During the patterning process, portions of the second conductive layer pattern 20 exposed by the aperture 22b in the capacitor forming region C, i.e., in the upper electrode 20b, and the aperture 22c in the pixel forming region P, i.e., in the anode electrode, may be removed using the fourth mask.

Figure 3G:
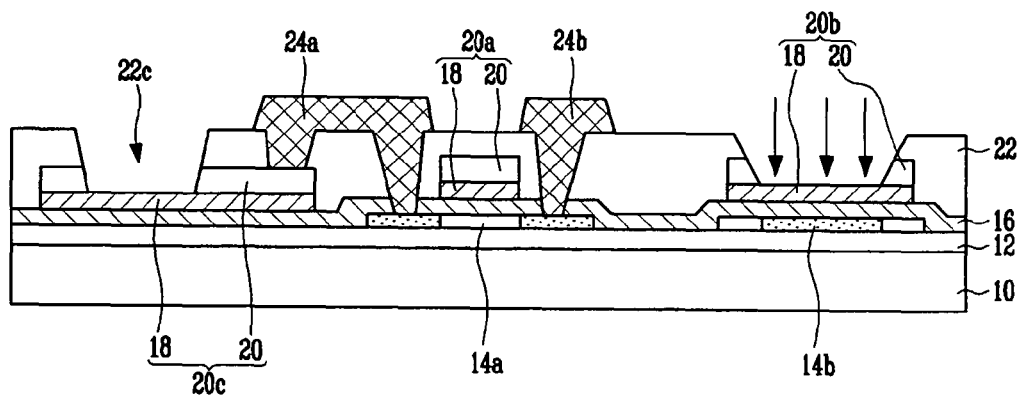

Referring to FIG. 3G, dopant ions may be implanted into the lower electrode 14b through the aperture 22b in the capacitor forming region C. In the implanting process, since the dopant ions may be implanted into the lower electrode 14b through exposed portions of the first conductive layer pattern 18 and the first insulating layer 16, an ion implantation energy may be adjusted such that the lower electrode 14b including the semiconductor layer has sufficient conductivity.

Figure 3H:
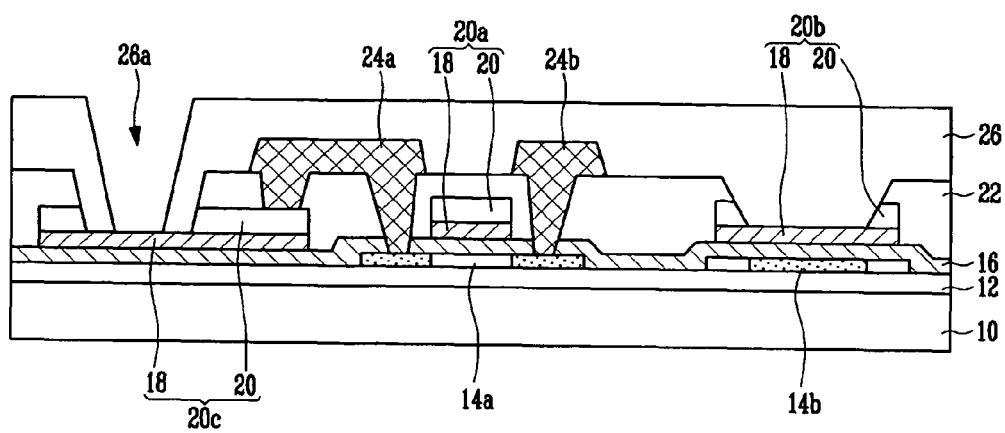

Referring to FIG. 3H, a pixel defining layer 26 may be formed on the second insulating layer 22 including the source electrode 24a and the drain electrode 24b thereon. Portions of the anode electrode 20c in the light emitting region may be exposed by patterning the pixel defining layer 26 by, e.g., photolithography and etching, using a fifth mask.

Figure 3I:
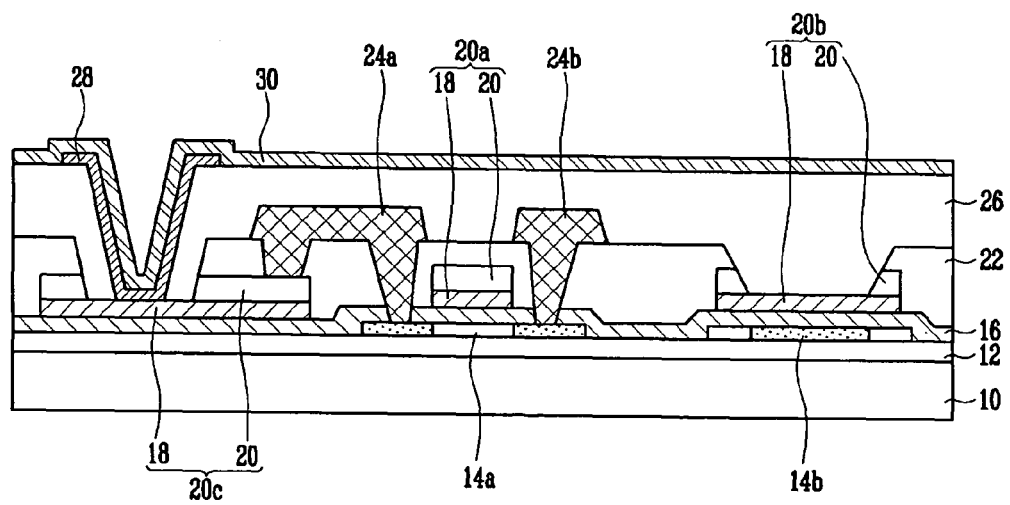

Referring to FIG. 3I, an organic light emitting layer 28 may be formed on exposed portions of the anode electrode 20c of the light emitting region 26a. Then, a cathode electrode 30 may be formed on the pixel defining layer 26 including the organic light emitting layer 28 thereon.

The method according to the present embodiment may help ensure ideal ion implantation conditions by removing portions of the second conductive layer pattern 20 exposed by the aperture 22b in the capacitor forming region C. The portions of the second conductive layer pattern 20 exposed by the aperture 22b may be removed using the fourth mask, i.e., the same mask for forming the source electrode 24a and the drain electrode 24b. Accordingly, the implantation may provide the lower electrode 14b with sufficient conductivity without using a separate mask (see FIGS. 3F and 3G). Thus, it is possible to manufacture a flat panel display device using only five masks (first to fifth masks), thereby reducing manufacturing costs by decreasing a number of masks and processes.

Further, since a capacitor having a MOS (Metal-Oxide-Semiconductor) structure including the lower electrode 14b-insulating layer 16-upper electrode 20b is implemented by a manufacturing process of a thin film transistor, it is possible to achieve high electrostatic capacity by using the relatively thin insulating layer ($SiO_2$) 16 as a dielectric. In addition, as high electrostatic capacity may be achieved from a relatively small area, it is possible to relatively increase a size (aperture ratio) of the light emitting region.

Figure 4:
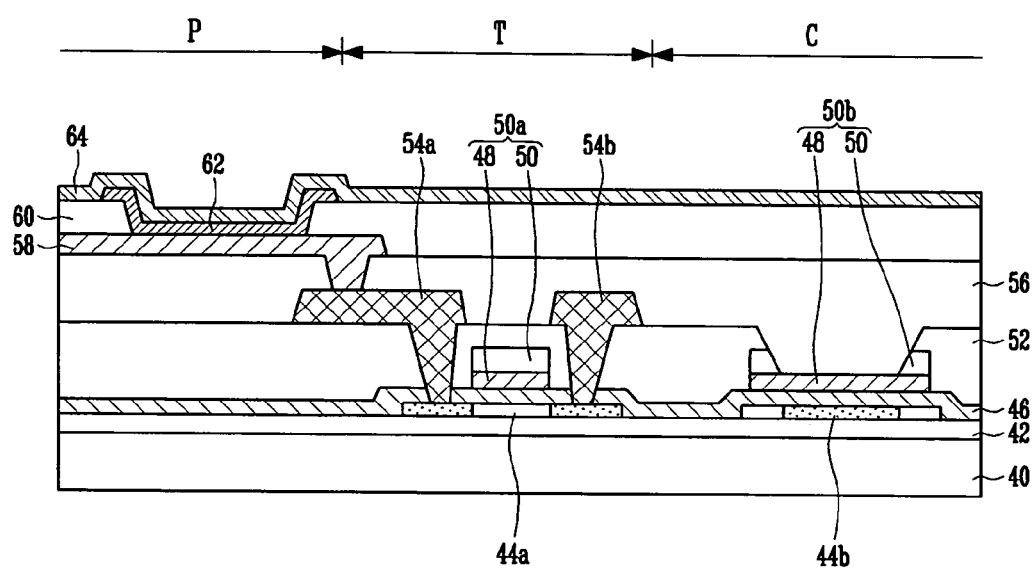
FIG. 4 illustrates a cross-sectional view of a flat panel display device according to yet another embodiment.

FIG. 4 illustrates a cross-sectional view of a flat panel display device according to another embodiment. In particular, FIG. 4 illustrates a top emission type organic light emitting display device.

A substrate 40 including an insulating material, e.g., transparent glass and/or plastic, may include a thin film transistor forming region T, a capacitor forming region C, and a pixel forming region P. A buffer layer 42 may be disposed on the substrate 40 in the thin film transistor forming region T, the capacitor forming region C, and the pixel forming region P. An active layer 44a including a channel region, a source region, and a drain region may be disposed on the buffer layer 12 in the thin film transistor forming region T. A lower electrode 44b may be disposed on the buffer layer 42 in the capacitor forming region C. The active layer 44a and the lower electrode 44b may include a semiconductor material, e.g., amorphous silicon or polysilicon. Dopant ions may be implanted in the lower electrode 44d for conductivity. In an implementation, the lower electrode 44b and the active layer 44a may be disposed in the same plane on the buffer layer 42.

A first insulating layer 46 may be disposed on the buffer layer 12 including the active layer 44a and the lower electrode 44b thereon. The first insulating layer 46 may serve as a gate insulating layer of the thin film transistor and a dielectric of the capacitor.

A gate electrode 50a including a first conductive layer pattern 48 and a second conductive layer pattern 50 may be disposed on the first insulating layer 46 over, i.e., may overlie, the active layer 44a. An upper electrode 50b including the first conductive layer pattern 48 and the second conductive layer pattern 50 may be disposed on the first insulating layer 46 over, i.e., may overlie, the lower electrode 44b. In an implementation, the first conductive layer patterns 48 and the second conductive layer patterns 50 of the gate electrode 50a and upper electrode 50b may be disposed in the same plane, respectively, on the first insulating layer 46.

A second insulating layer 52 may be disposed on the first insulating layer 46 including the gate electrode 50a and the upper electrode 50b thereon. An aperture pattern, i.e., a plurality of openings, may be formed in the second insulating layer 52 to expose portions of the source and drain regions of the active layer 44a as well as portions of the upper electrode 50b. The second conductive layer pattern 50 of the upper electrode 50b may be interposed between edges of the corresponding first conductive layer pattern 48 and the second insulating layer 52 thereon. The first conductive layer pattern 48 may include, e.g., a transparent conductive material; and the second conductive layer pattern 50 may include, e.g., a metal and/or an alloy.

A source electrode 54a and drain electrode 54b may be disposed on the second insulating layer 52 and may be connected to source and drain regions, respectively, of the active layer 44a through the aperture pattern. A third insulating layer 56 may be disposed on the second insulating layer 52 including the source electrode 54a and the drain electrode 54b thereon. A via-hole may be formed in the third insulating layer 56 to expose portions of the source electrode 54a or the drain electrode 54b.

An anode electrode 58 may be disposed on the third insulating layer 56 and may be connected to exposed portions of the source electrode 54a or the drain electrode 54b through the via-hole. A pixel defining layer 60 may be disposed on the third insulating layer 56 including the anode electrode 58 thereon. An aperture may be formed in the pixel defining layer 60 to expose portions of the anode electrode 58 in the light emitting region. An organic light emitting layer 62 may be disposed on the exposed portion of the anode electrode 58 in the light emitting region. A cathode electrode 64 may be disposed on the pixel defining layer 60 including the organic light emitting layer 62 thereon.

In the flat panel display device of the present embodiment, signals provided from outside may be stored in the capacitor. In addition, signals may be provided to the anode electrode 58 by the thin film transistor. Therefore, when a predetermined voltage is applied to the anode electrode 58 and the cathode electrode 64, holes injected from the anode electrode 58 and electrons injected from the cathode electrode 64 may be recombined in the organic light emitting layer 62. Thus, characters and/or images may be displayed by light emitted from the organic light emitting layer 62 to the outside.

FIGS. 5A to 5H illustrate cross-sectional views of stages in a method of manufacturing a flat panel display device according to another embodiment. In particular, the method of the present embodiment may form a flat panel display device having the structure of FIG. 4.

Figure 5A:
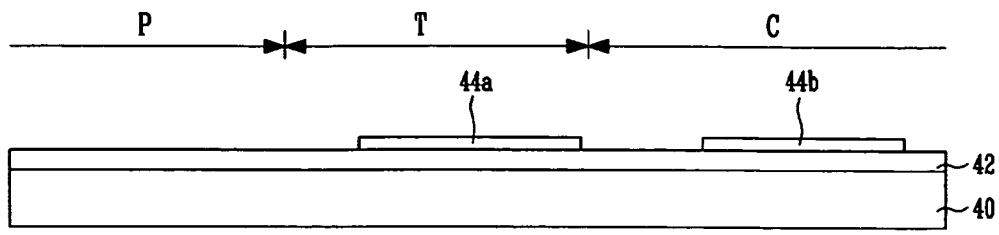
FIGS. 5A to 5H illustrates cross-sectional views of stages in a method of manufacturing a flat panel display device according to another embodiment.

Referring to FIG. 5A, a substrate 40 including a thin film transistor forming region T, a capacitor forming region C, and a pixel forming region P may be provided. A buffer layer 42 and a semiconductor layer (not illustrated) may be sequentially formed on the substrate 40 including the thin film transistor forming region T, the capacitor forming region C, and the pixel forming region P. The semiconductor layer may be patterned to form an active layer 44a including a channel region, a source region, and a drain region on the buffer layer 42 in the thin film transistor forming region T as well as a lower electrode 44b on the buffer layer 42 in the capacitor forming region C. Thus, the active layer 44a and the lower electrode 44b may be formed at the same time. The patterning may be carried out by, e.g., photolithography and etching, using a first mask. The semiconductor layer may include, e.g., amorphous silicon or polysilicon, and, if desired, may be subjected to crystallization.

Figure 5B:
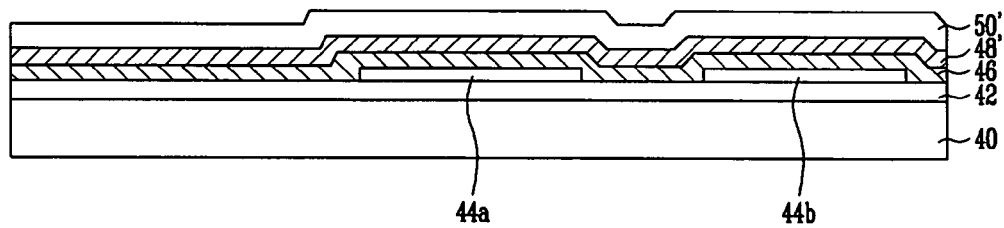

Referring to FIG. 5B, a first insulating layer 46, a first conductive layer 48', and a second conductive layer 50' may be sequentially formed on the buffer layer 42 including the active layer 44a and the lower electrode 44b thereon. The first insulating layer 46 may include, e.g., a silicon oxide film $SiO_2$. The first conductive layer 48' may include, e.g., a transparent conductive material having conductivity sufficient to be used an electrode. In an implementation, the transparent conductive material may include, e.g., amorphous ITO, ITO, poly-ITO, and/or IZO. The second conductive layer 50' may include, e.g., a metal. In an implementation, the metal may include, e.g., tungsten (W), titanium (Ti), molybdenum (Mo), silver (Ag), tantalum (Ta), aluminum (Al), copper (Cu), gold (Au), chromium (Cr), niobium (Nb), and/or alloys thereof.

Figure 5C:
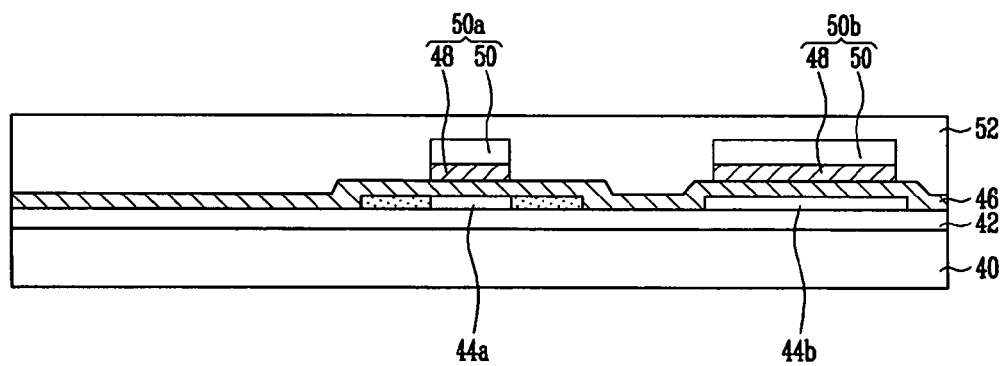

Referring to FIG. 5C, a gate electrode 50a and an upper electrode 50b may be formed on the active layer 44a and the lower electrode 44b by patterning the second conductive layer 50' and the first conductive layer 48' by, e.g., photolithography and etching, using a second mask. Thus, the gate electrode 50a and the upper electrode 50b may each include a first conductive layer pattern 48 and a second conductive layer pattern 50 and may be formed at the same time. In an implementation, high-density dopant ions may be implanted into the source and drain regions of the active layer 44a using the gate electrode 50a as a mask.

Then, a second insulating layer 52 may be formed on the first insulating layer 46 including the gate electrode 50a and the upper electrode 50b thereon.

Figure 5D:
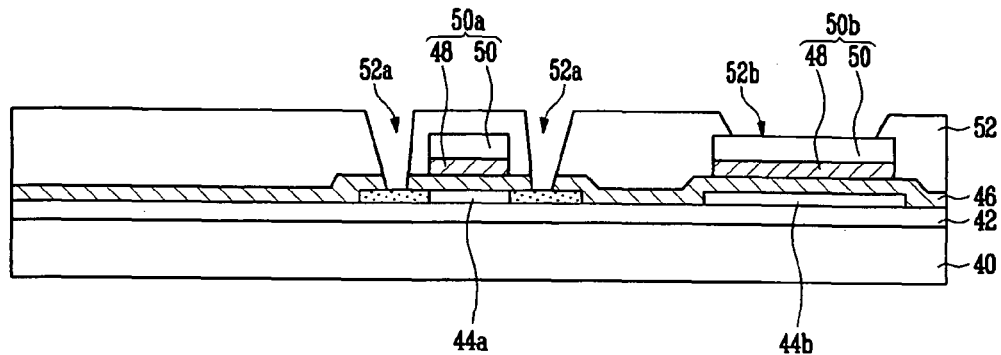

Referring to FIG. 5D, an aperture pattern, i.e., a plurality of openings, including apertures 52a and 52b may be formed by patterning the second insulating layer 52 and the first insulating layer 46 by, e.g., photolithography and etching, using a third mask. The apertures 52a and 52b may expose portions of the source and drain regions of the active layer 44a as well as portions of the upper electrode 50b, respectively.

Figure 5E:
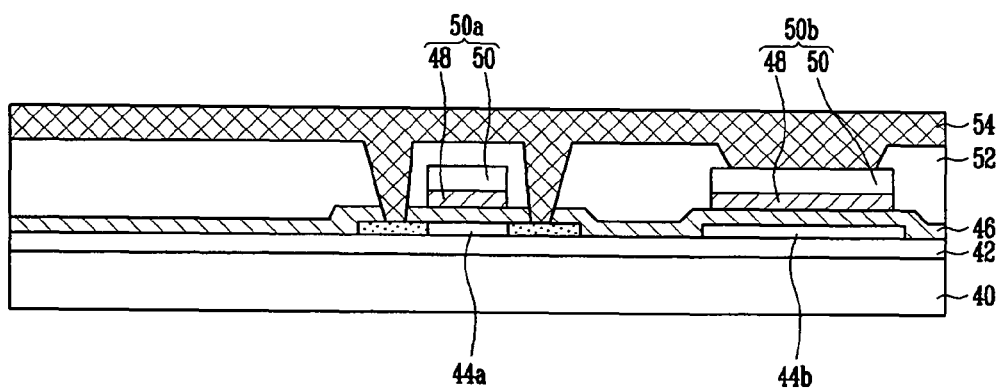

Referring to FIG. 5E, a conductive layer 54 may be formed on the second insulating layer 52 to fill the apertures 22a and 52b.

Figure 5F:
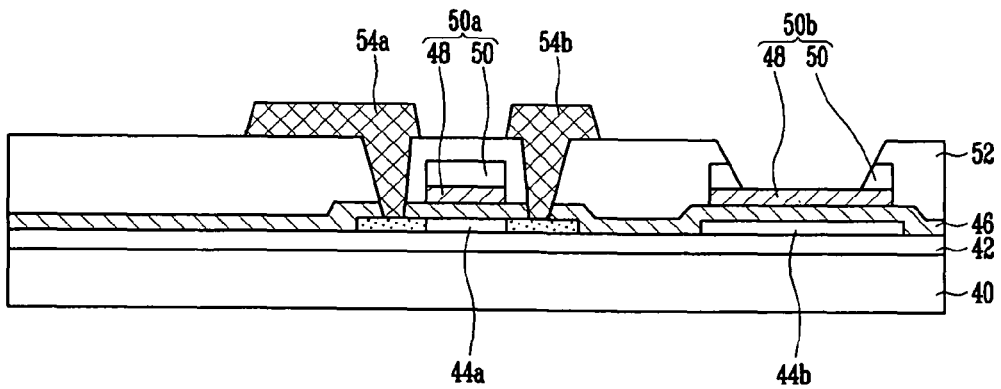

Referring to FIG. 5F, the conductive layer 54 may be patterned to form a source electrode 54a connected to the source region of the active layer 44a and a drain electrode 54b connected to the drain region of the active layer 44a through the aperture 52a. The patterning may be carried out by, e.g., photolithography and etching, using a fourth mask. During the patterning process, portions of the second conductive layer pattern 50 exposed by the aperture 52b in the capacitor forming region C may be removed using the fourth mask.

Figure 5G:
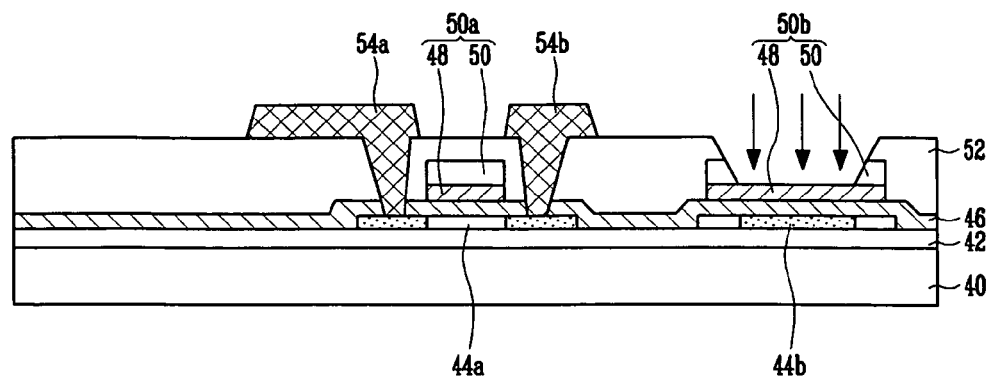

Referring to FIG. 5G, dopant ions may be implanted into the lower electrode 44b through the aperture 52b in the capacitor forming region C. In the implantation process, since the dopant ions may be implanted into the lower electrode 44b through the exposed portions of the first conductive layer pattern 48 and first insulating layer 46, ion implantation energy may be adjusted such that the lower electrode 44b including the semiconductor material has sufficient conductivity.

Figure 5H:
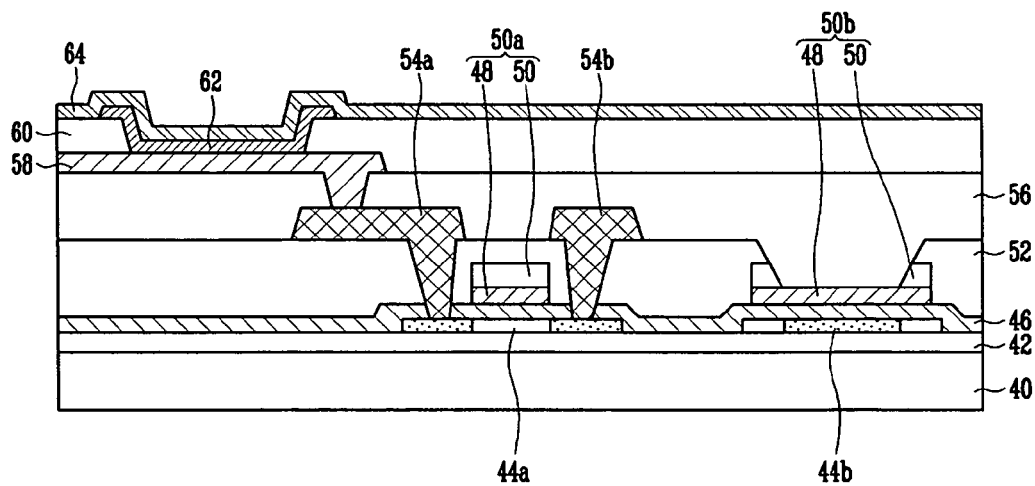

Referring to FIG. 5H, a third insulating layer 56 may be formed on the second insulating layer 52 including the source electrode 54a and the drain electrode 54b thereon. A via-hole may be formed to expose portions of the source electrode 54a or the drain electrode 54b by patterning the third insulating layer 56 by, e.g., photolithography and etching, using a fifth mask.

A conductive layer (not illustrated) may be formed on the third insulating layer 56 to fill the via-hole. An anode electrode 58 connected to exposed portions of the source electrode 54a or drain electrode 54b through the via-hole may be formed by patterning the conductive layer by, e.g., photolithography and etching, using a sixth mask.

A pixel defining layer 60 may be formed on the third insulating layer 56 including the anode electrode 58 thereon. An aperture may be formed to expose portions of the anode electrode 58 in the light emitting region by patterning the pixel defining layer 60 by, e.g., photolithography and etching, using a seventh mask. Further, an organic light emitting layer 62 may be formed on exposed portions of the anode electrode 58 in the light emitting region. A cathode electrode 64 may be formed on the pixel defining layer 60 including the organic light emitting layer 62 thereon.

The method according to the present embodiment may help ensure suitable ion implantation conditions by removing portions of the second conductive layer pattern 50 exposed by the aperture 52b in the capacitor forming region C. the portions of the second conductive layer pattern 50 exposed by the aperture 52b may be removed using the fourth mask, i.e., the same mask for forming the source electrode 54a and drain electrode 54b. Accordingly, the implantation may provide the lower electrode 44b with sufficient conductivity without using a separate mask (see FIGS. 5F and 5G). Thus, it is possible to manufacture a flat panel display device using fewer masks, thereby reducing manufacturing costs by decreasing a number of masks and processes.

Further, since a capacitor having a MOS (Metal-Oxide-Semiconductor) structure including the lower electrode 44b-insulating layer 46-upper electrode 50b may be formed by the manufacturing process of an embodiment, it is possible to achieve high electrostatic capacity by using a relatively thin insulating layer ($SiO_2$) 46 as a dielectric. As high electrostatic capacity may be achieved from a relatively small area, it is possible to relatively increase a size (aperture ratio) of the light emitting region.

Since dopant ions may be implanted in the lower electrode formed of a semiconductor material without using a separate mask to provide conductivity, it is possible to manufacture a flat panel display device, using, e.g., five masks (first to fifth masks). Therefore, it is possible to reduce manufacturing cost by decreasing the number of masks and processes, as compared with the related art. Thus, it may not cost a great deal to manufacture the devices due to a limited number of masks; and yield may be increased due to the reduction in process steps, such that overall manufacturing cost may decrease.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flat panel display device, comprising:
a substrate, the substrate including a first region and a second region;
an active layer on the first region of the substrate, the active layer including a semiconductor material;
a lower electrode on the second region of the substrate, the lower electrode including the semiconductor material;
a first insulating layer on the substrate including the active layer and the lower electrode thereon;
a gate electrode on the first insulating layer, the gate electrode overlying the active layer and including a first conductive layer pattern and a second conductive layer pattern;
an upper electrode on the first insulating layer, the upper electrode overlying the lower electrode and including the first conductive layer pattern and the second conductive layer pattern;
a second insulating layer on the gate electrode and the upper electrode, the second insulating layer exposing portions of the active layer and portions of the upper electrode; and
a source electrode and a drain electrode connected to the exposed portions of the active layer,
wherein:
the second conductive layer pattern corresponding to the upper electrode includes an opening exposing a portion of the first conductive layer pattern therethrough, and
the lower electrode corresponding to the opening includes dopant ions.

2. The flat panel display device as claimed in claim 1, wherein the semiconductor material includes amorphous silicon or a polysilicon.

3. The flat panel display device as claimed in claim 1, wherein the first conductive layer pattern includes at least one of amorphous ITO, ITO, poly-ITO, and IZO.

4. The flat panel display device as claimed in claim 1, wherein the second conductive layer pattern includes at least one of tungsten (W), titanium (Ti), molybdenum (Mo), silver (Ag), tantalum (Ta), aluminum (Al), copper (Cu), gold (Au), chromium (Cr), niobium (Nb), and alloys thereof.

5. The flat panel display device as claimed in claim 1, wherein the second conductive layer pattern corresponding to the upper electrode is interposed between edges of the corresponding first conductive layer pattern and the second insulating layer thereon.

* * * * *